(12) United States Patent
Kim

(10) Patent No.: US 7,247,580 B2
(45) Date of Patent: Jul. 24, 2007

(54) DEVICES AND METHODS OF PREVENTING PLASMA CHARGING DAMAGE IN SEMICONDUCTOR DEVICES

(75) Inventor: Jae Hee Kim, Gyeonggi-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/027,049

(22) Filed: Dec. 30, 2004

(65) Prior Publication Data

US 2006/0148235 A1  Jul. 6, 2006

(30) Foreign Application Priority Data

Dec. 31, 2003  (KR) ...................... 10-2003-0101298

(51) Int. Cl.
*H01L 21/31* (2006.01)
(52) U.S. Cl. ...................................... 438/761; 438/622
(58) Field of Classification Search ................. 438/724, 438/761, 622
See application file for complete search history.

(56) References Cited

U.S. PATENT DOCUMENTS

| | | | |
|---|---|---|---|
| 5,866,482 A * | 2/1999 | Lee | 438/720 |
| 5,877,082 A | 3/1999 | Kimizuka et al. | |
| 6,080,658 A * | 6/2000 | Huang et al. | 438/629 |
| 6,110,841 A | 8/2000 | Wang et al. | |
| 6,211,051 B1 | 4/2001 | Jurgensen et al. | |
| 6,277,723 B1 * | 8/2001 | Shih et al. | 438/597 |
| 6,806,096 B1 * | 10/2004 | Kim et al. | 438/3 |
| 2005/0067702 A1 * | 3/2005 | America et al. | 257/753 |

* cited by examiner

*Primary Examiner*—Douglas M. Menz
(74) *Attorney, Agent, or Firm*—Saliwanchik, Lloyd & Saliwanchik

(57) ABSTRACT

Methods for protecting semiconductor devices from plasma charging damage are disclosed. An example disclosed method includes depositing an etching stop layer on a substrate with at least one predetermined structure; depositing a premetallic dielectric layer and a charge preservation layer on the entire surface of the etching stop layer; depositing an insulating layer on the surface of the resulting structure; and forming an metallic interconnect on the insulating layer.

7 Claims, 2 Drawing Sheets

DEVICES AND METHODS OF PREVENTING PLASMA CHARGING DAMAGE IN SEMICONDUCTOR DEVICES

TECHNICAL FIELD

The present disclosure relates generally to semiconductor fabrication and, more particularly, to devices and methods of preventing plasma charging damage in semiconductor devices.

BACKGROUND

The use of plasma in semiconductor device fabrication provides directionality, low temperature, and processing convenience. Accordingly, plasma is typically used in etch and deposition processes for fabricating semiconductor devices. However, the plasma also introduces a potential for increased semiconductor damage due to surface charging of a semiconductor device. This surface charging during the plasma processing is often referred to as plasma charging damage. As the thickness of a gate oxide layer continue to decrease to improve device performance, the plasma charging damage is becoming a large concern because it can severely and directly degrade the electrical properties of the gate oxide layer. Especially, after the formation of a first metallic interconnect having the highest antenna ratio among metallic interconnects and in contact with a transistor, the probability of the occurrence of the plasma charging damage is getting greater. However, a conventional Pre-Metallic Dielectric (PMD) layer does not contain any material that can prevent the occurrence of the plasma charging damage.

Referring to FIG. 1, a conventional PMD layer including a nitride layer 11 as an etching stop layer, a BPSG layer 12, and an oxide layer 13 as a capping layer are placed on a substrate with at least one structure. A metallic interconnect 14 is placed on the PMD layer. A first Inter-Layer Dielectric (ILD) 15, a second insulating layer 16, a second metallic interconnect 17, and a second ILD 18 are sequentially and repeatedly placed on the device.

However, the nitride layer 11, the BPSG 12, and the oxide layer 13 have shortcomings such as poor charge preservation and are, therefore, unable to protect the semiconductor device from the plasma charging damage.

DETAILED DESCRIPTION

Figure 1:
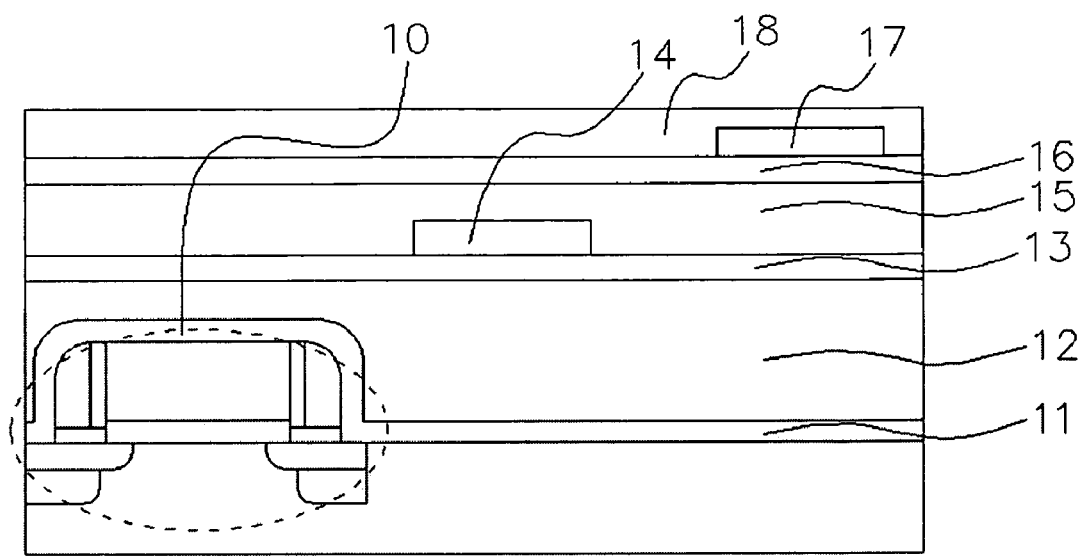
FIG. 1 is a cross-sectional view illustrating a known structure affected by the plasma charging damages.
Figure 2A:
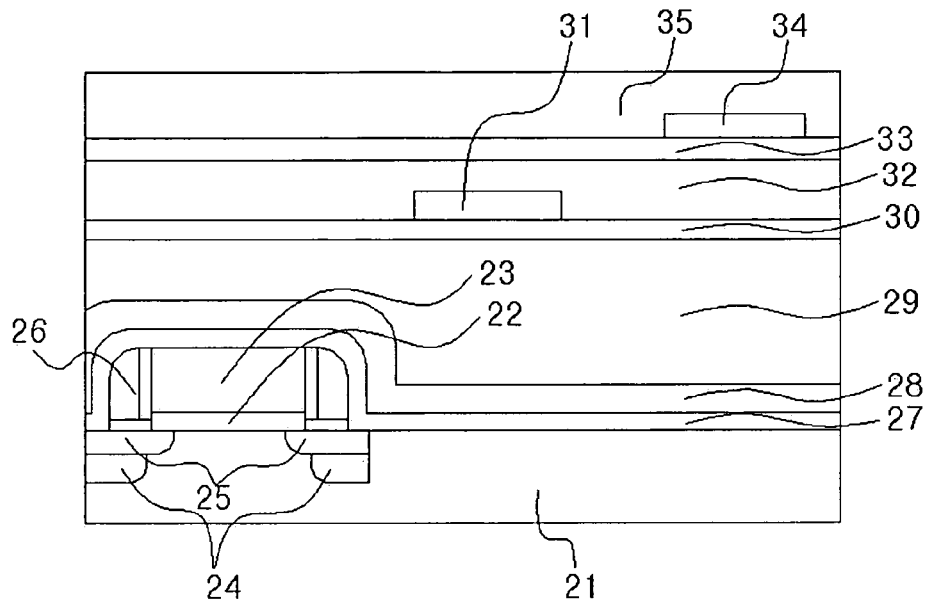
FIGS. 2a and 2b are cross-sectional views illustrating devices constructed in accordance with disclosed methods for preventing plasma charging damages.

Referring to FIG. 2a, a gate oxide layer 22 is grown on a substrate 21. Next, a gate electrode 23 is formed on the gate oxide layer 22. Subsequently, a Lightly Doped Drain (LDD) structure 25 is formed around the gate electrode 23 by an ion implantation process by using the gate electrode 23 and the gate oxide layer 22 as a mask. Spacers 26 are formed on the lateral faces of the gate electrodes. Source and drain regions 24 having the LDD structure 25 are then formed around the gate electrode 23. A nitride layer 27 is then formed on the resulting structure.

Subsequently, a charge preservation layer 28 is formed on the nitride layer 27 to prevent the deterioration of the gate oxide layer by charges induced from a first metallic interconnect or a second metallic interconnect. The charge preservation layer 28 may be polysilicon and may be formed by a plasma treatment or a thermal treatment. The charge preservation layer 28 may have a thickness between 150 Å and 1000 Å, to suppress the increase in delay time generated by a capacitance.

Next, a BPSG layer 29 is deposited on entire surface of the charge preservation layer 28. A first oxide layer 30 and the first metallic interconnect 31, a first ILD 32, a second oxide layer 33, the second metallic interconnect 34, and a second ILD 35 are sequentially formed. If more layers are required, the identical process as described above will be performed sequentially and repeatedly.

Figure 2B:
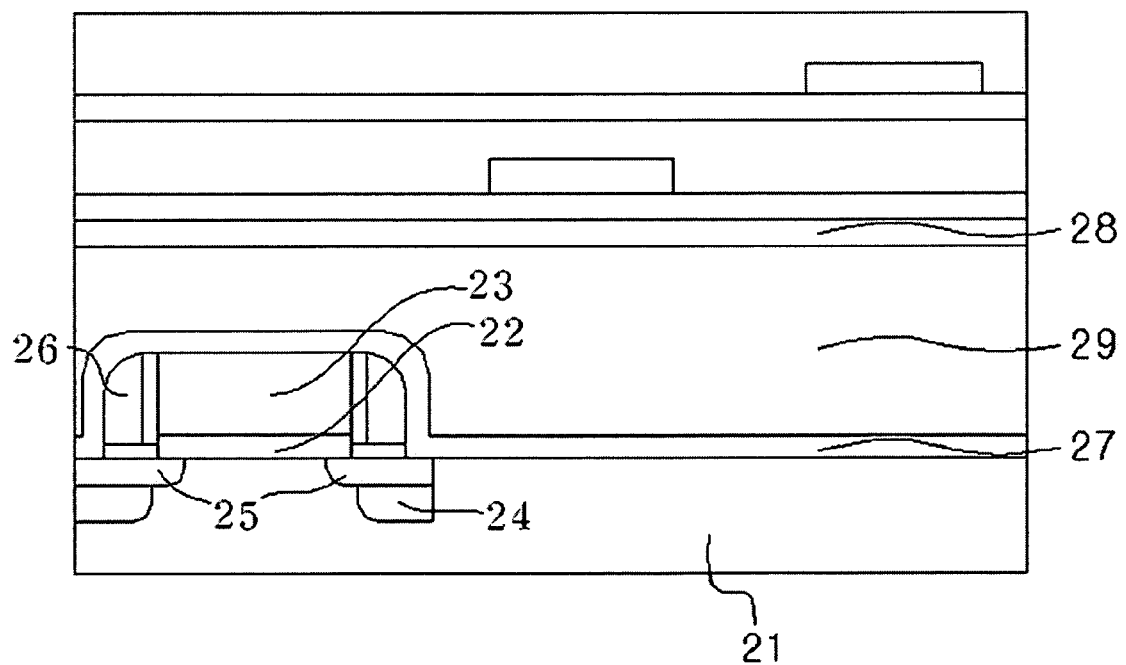

Referring to FIG. 2b, a charge preservation layer is deposited after the depostion of a BPSG layer. In detail, a gate oxide layer 22 is grown on a substrate 21. Next, a gate electrode is formed on the surface of the gate oxide layer 22. Subsequently, an LDD structure 25 is formed around the gate electrode 23 by an ion implantation process by using the gate electrode 23 and the gate oxide layer 22 as mask. Spacers 26 are formed on the lateral faces of the gate electrodes 23. Source and drain regions 24 having the LDD structure 25 are then formed around the gate electrode 22. A nitride layer 27 is then formed on the resulting structure.

Next, a BPSG layer 29 is formed on entire surface of the resulting structure. The charge preservation layer 28 made of polysilicon with the same objective as described is then deposited on the BPSG layer 29. Thus, the device for preventing plasma charging damages, as disclosed herein is constructed as follows.

Accordingly, by means of forming a BPSG layer before or after the deposition of the charge preservation layer, the disclosed methods and apparatus provide the methods for preventing plasma charging damages such as the deterioration of the gate oxide layer due to the plasma-induced charge through metallic interconnects on the gate electrode. In addition, the methods disclosed herein can improve the Time Dependent Dielectric Breakdown (TDDB) of the semiconductor device and suppress leakage current, thereby increasing the reliability of the semiconductor device. An etching stop layer is placed on a substrate with at least one predetermined structure. A premetallic dielectric layer and a charge preservation layer are placed on the entire surface of the etching stop layer. An insulating layer is positioned on the surface of the resulting structure. A metallic interconnect is placed on the insulating layer.

It is noted that this patent claims priority from Korean Patent Application Serial Number 10-2003-0101298, which was filed on Dec. 31, 2004, and is hereby incorporated by reference in its entirety.

Although certain example methods, apparatus, and articles of manufacture have been described herein, the scope of coverage of this patent is not limited thereto. On the contrary, this patent covers all methods, apparatus, and articles of manufacture fairly falling within the scope of the appended claims either literally or under the doctrine of equivalents.

What is claimed is:

1. A method for preventing plasma charging damages comprising:

sequentially forming a gate insulating layer, a gate electrode, and a source and drain region on a substrate;

depositing an etching stop layer on the substrate;

depositing a premetallic dielectric layer and a charge preservation layer on the entire surface of the etching stop layer, wherein the charge preservation layer comprises polysilicon;

depositing an insulating layer on the surface of the resulting structure; and forming an metallic interconnect on the insulating layer.

2. The method as defined by claim 1, wherein the etching stop layer comprises a silicon nitride layer.

3. The method as defined by claim 1, wherein the premetallic dielectric layer comprises BPSG.

4. The method as defined by claim 1, wherein the premetallic dielectric layer is deposited after the deposition of the charge preservation layer.

5. The method as defined by claim 1, wherein the premetallic dielelectric layer is deposited before the deposition of the charge preservation layer.

6. The method as defined by claim 1, wherein the charge preservation layer is deposited with a thickness between about 150 Å and about 1000 Å.

7. The method as defined by claim 1, wherein the premetallic dielectric layer is deposited both before and after the deposition of the charge preservation layer.

* * * * *